United States Patent [19]

Kodama et al.

[11] Patent Number: 4,507,755

[45] Date of Patent: Mar. 26, 1985

[54] MAGNETIC BUBBLE MEMORY DEVICE

[75] Inventors: Naoki Kodama, Hachioji; Teruaki Takeuchi, Kokubunji; Ryo Suzuki, Kodaira; Masatoshi Takeshita, Hachioji; Yutaka Sugita, Tokorozawa, all of Japan

[73] Assignee: Hitachi, Ltd., Tokyo, Japan

[21] Appl. No.: 550,589

[22] Filed: Nov. 10, 1983

[30] Foreign Application Priority Data

Nov. 12, 1982 [JP] Japan ................................. 57-197507

[51] Int. Cl.³ .............................................. G11C 19/08
[52] U.S. Cl. .............................................................. 365/36
[58] Field of Search ...................................... 365/1, 36

[56] References Cited

U.S. PATENT DOCUMENTS 4,263,662 4/1981 Keefe et al. .......................... 365/36

Primary Examiner—James W. Moffitt
Attorney, Agent, or Firm—Antonelli, Terry & Wands

[57] ABSTRACT

A magnetic bubble memory device comprises a magnetic bubble propagation track formed by ion implantation. A region enclosed by the propagation track and lightly or shallowly implanted with ions on a condition differing from that for forming the propagation track or not implanted with ions at all is provided with a island-like isolated region heavily or deeply implanted with ions on the same condition as that for forming the propagation track.

7 Claims, 13 Drawing Figures

MAGNETIC BUBBLE MEMORY DEVICE

BACKGROUND OF THE INVENTION

The present invention relates to a magnetic bubble memory device having propagation tracks formed by ion implantation.

FIG. 1 illustrates the principle of the magnetic bubble propagation in a magnetic bubble memory device having propagation tracks formed by ion implanation. A magnetic layer 2 having a uniaxial anisotropy and capable of holding magnetic bubbles 4 is formed on a non-magnetic substrate 1. A contiguous-disk mask made of, for example, molybdenum and silicon is provided on the magnetic layer 2 and an unmasked region is implanted with hydrogen ions or neon ions to form an ion-implanted layer 3. In this structure, the magnetization 8 of the ion-impanted layer 3 lies in a plane of the layer 3. The direction of the magnetization 8 parallel to the plane of the ion-implanted layer 3 can be changed by a rotating magnetic field 6 applied in parallel to the plane of the layer 3. At a boundary between the ion-implanted region and the non-implanted region 5 are developed charged walls 9 each having a magnetic pole due to convergence or divergence of the magnetization 8. When the charged wall 9 is caused to move along the boundary, i.e. the edge of the bubble propagation track under action of the in-plane rotating field 6, the magnetic bubble is propagated following the movement of the charged wall 9.

Bubble propagation characteristics have been examined when the width w (see FIG. 2) of the non-implanted region as measured from the bottom 11 of a cusp 10 located along the propagation track having a periodical length of 4 μm was varied. In this connection, the term "cusp" refers to a concaved area which is located within the region implanted with ions to form the meandering propagation track and is enclosed by the boundary between the ion-implanted region and the non-implanted region at a smaller angle than 180°.

FIG. 3 graphically illustrates relationships between the biasing magnetic field and the rotating magnetic field with the width w being taken as a parameter. The abscissa represents the intensity of the rotating field and the ordinate represents the intensity of the binasing field under which the bubble can be propagated. It will be seen from FIG. 3 that the minimum value of the rotating field becomes greater as the width w of the non-implanted region is increased. FIG. 4 graphically shows the results of examination of the charged walls appearing along the propagation track, the examination having been carried out by Bitter technique (using "Ferrofluid"). More specifically, it has been examined in which phase of the rotating field appears a charged wall 9 (FIG. 5) necessary for driving a magnetic bubble at the bottom of a cusp into the next adjacent cusp. In FIG. 4, the phase or angle of the rotating field at which the charged wall 9 appears with reference to the direction of 0° (degree) shown in FIG. 5, is taken along the ordinate. The width w of the non-implanated region measured from the bottom 11 of the cusp is taken along the abscissa. A curve a corresponds to the case of the rotating field of 30 Oe, while a curve b corresponds to the case of the rotating field of 60 Oe. As will be seen from FIG. 4, the charged wall 9 appears with greater phase delay as the width w of the non-implanted region is increased. Reference may be made to Kodama et al: Digests of the fifth annual conference on Magnetics of the Magnetic Society of Japan, October 1981, p. 164.

In the hitherto known magnetic bubble device in which magnetic bubbles of 2 μm in diameter are employed, a structure implementing minor loops and two major lines has been adopted. More specifically as shown in FIG. 6, the magnetic bubble memory device comprises a group of minor loops 13 for storing information, a write-in major line 16 including a generator 14 and swap gates 15 for writing information, and a read-out major line 19 including replicate gates 18 each for dividing the bubble of the associated minor loop 13 into two upon reading of information to transfer one thereof to a detector 17. When a structure similar to such a magnetic bubble memory device employing magnetic bubbles of 2 μm is to be applied to a high density magnetic bubble memory device using magnetic bubble of 1 μm in diameter, it is required to reduce not only the periodicity of the basic propagation track in each minor loop but also the periodicity of the minor loops. To meet this requirement, functional parts such as the swap gates, the replicate gates and other have to be reduced in size, which means that the width of conductors provided in association with the functional parts must be correspondingly decreased. However, since the conductors are usually formed of a metal such as Au, Al-Cu or the like, migration will take place when the current density is excessively high. In other words, an upper limit is imposed on magnitude of the current density, giving rise to a problem that the current required for controlling the magnetic bubbles can no more be conducted. To evade this difficulty, there has been proposed a structure in which the periodicity of the minor loops is increased by folding each of them twice or more in a manner shown in FIG. 7, thereby enlarging the areas occupied by gates (see S. Orihara et al: "An 8 μm Period Bubble Memory Device with Relaxed Function Designs", IEEE TRANS., Vol. MAG-15, 1979, p. 1692 and also see M. Y. Dimyan and W. C. Hubbell: "Design and Operation of a 550K bit enhanced density 3 μm bubble memory chip", J. Appl. Phys. Vol. 50, 1979, p. 2225).

When the minor loop propagation track of the folded type mentioned above is made by ion implantation, there will be involved a propagation track pattern which is accompanied with a non-implanted region 20 of a large area as shown in FIG. 8 which shows in an enlarged view an area enclosed by a broken line circle A in FIG. 7. Examination of this region 20 with respect to the bubble propagation characteristic has shown that the magnetic bubble propagation cannot be accomplished in portions 21, 22 and 23 shown in FIG. 8 though the bubbles are propagated in the other portions.

SUMMARY OF THE INVENTION

It is an object of the present invention to overcome the aforementioned problem that the bubble propagation along the propagation track enclosing the large non-implanted area is difficult.

Another object of the invention is to improve the bubble propagation characteristic in the folded-type minor loop propagation track formed by ion implanation.

To that end, according to the invention, an additional ion-implanted region is formed in a non-implanted, lightly implanted or shallowly implanted region of a large area, thereby decreasing the area of the substantially non-implanted region located behind the cusps of the propagation track. With this structure, the above-mentioned difficulty that the magnetic bubbles cannot be otherwise propagated in the propagation track accompanied with the large substantially non-implanted region behind the cusps can be substantially eliminated.

DESCRIPTION OF THE PREFERRED EMBODIMENTS

Figure 1:
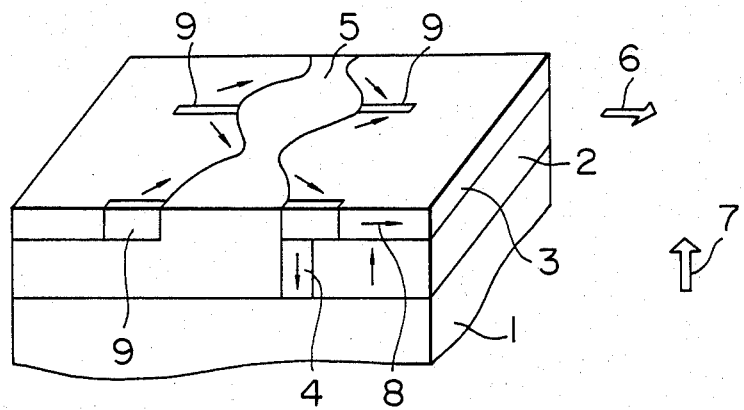
FIG. 1 is a fragmental sectional view of a magnetic bubble memory device for illustrating bubble propagation tracks formed by ion implantation.
Figure 2:
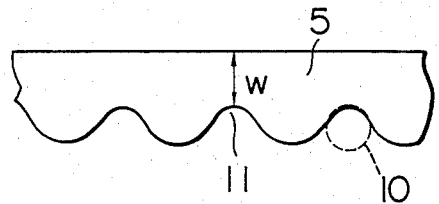
FIG. 2 is a view for illustrating a cusp-like pattern of the bubble propagation track and the width w of a region in which no ions are implanted.
Figure 3:
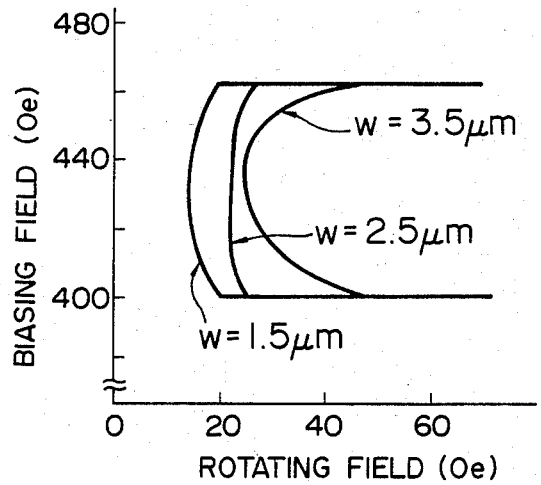
FIG. 3 is a view for graphically illustrating relationships between the biasing magnetic field and the rotating magnetic field for different widths w of the non-implanted region.
Figure 4:
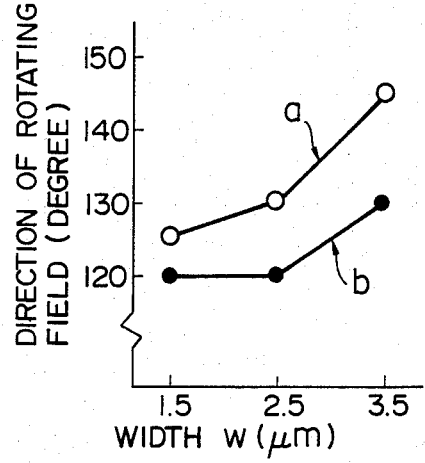
FIG. 4 is a view for graphically illustrating relationships between the width w of the non-implanted region and the direction or phase of the rotating field in which a charged wall appears.
Figure 5:
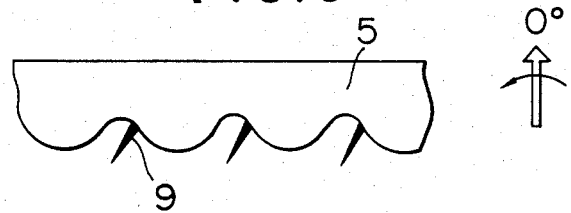
FIG. 5 is a view for illustrating the charged walls appearing at cusps.
Figure 6:
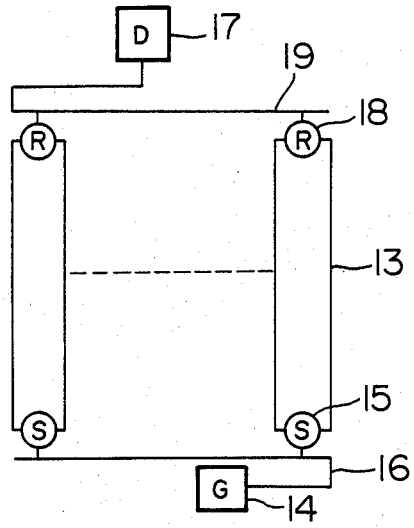
FIG. 6 is a schematic view for illustrating a structure of a magnetic bubble memory device comprising two major lines and minor loops.
Figure 7:
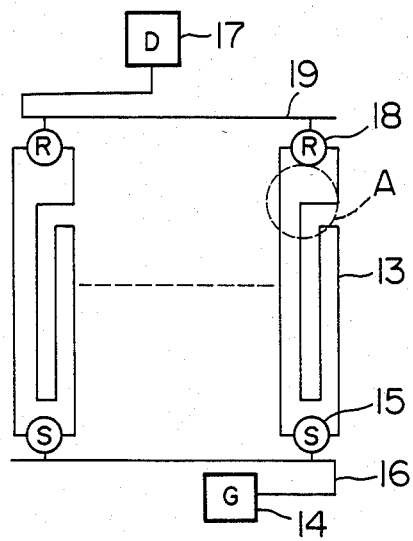
FIG. 7 is a schematic view for illustrating the structure of a magnetic bubble memory device comprising two major lines and minor loops in which each of the minor loops is implemented in a twice folded pattern.
Figure 8:
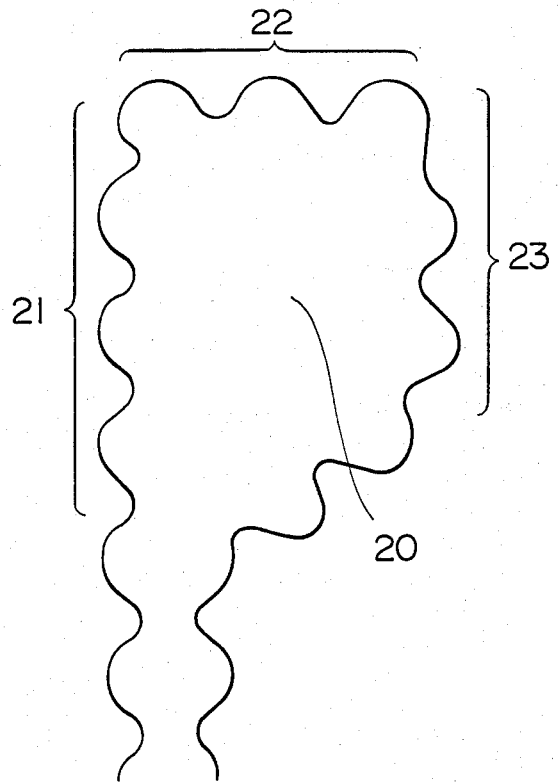
FIG. 8 is a view showing a propagation track accompanied with a non-implanted region of a large area.
Figure 9:
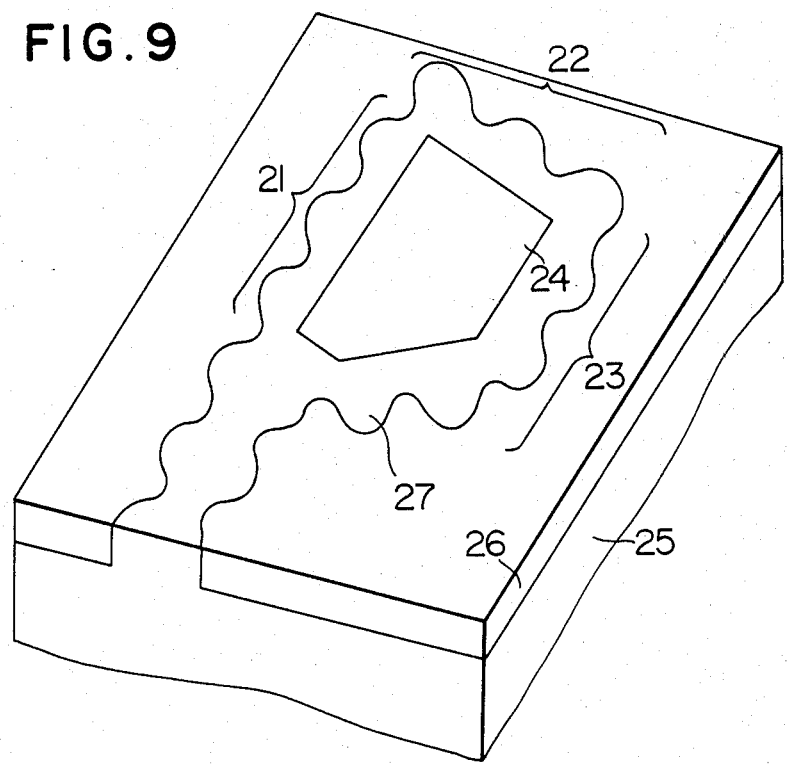
FIG. 9 is a view for illustrating a structure of the magnetic bubble memory device according to an embodiment of the present invention.
Figure 10:
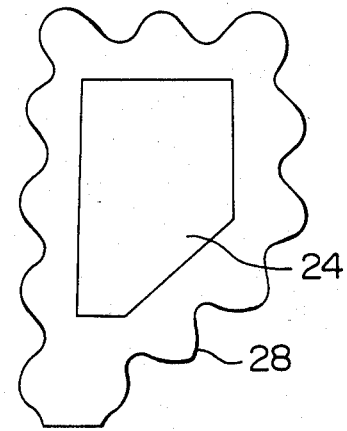
FIG. 10 is a fragmental plane view of FIG. 9 for illustrating ratio of areas of the ion-implanted and non-implanted regions.

An embodiment of the present invention will now be described referring to FIGS. 9 and 10. FIG. 9 shows a magnetic buble memory device in which an additional ion-implanted region 24 is provided in a non-implanted or lightly implanted region 27 located behind the cusps of portions 21, 22 and 23 of the propagation track which are incapable of propagation the magnetic bubble as described hereinbefore in conjunction with FIG. 8. The additional ion-implanted region 24 is formed by the procedures mentioned below.

In the magnetic bubble memory device in concern, the bubbles of 1 μm in diameter are to be employed. At first, the whole surface of a magnetic layer 25 is lightly implanted with neon (Ne+) ions with a dosage of $1 \times 10^{14}$ ions/cm$^2$ at an accelerating voltage of 50 KeV for suppressing generation of hard magnetic bubbles which are difficult to be rightly propagated. Subsequently, a mask of molybdenum for ion implantation is provided on the surface of the Ne+-implanted magnetic layer 25, which is followed by implantation of hydrogen (H+) ions with a dosage of $1 \times 10^{16}$ ions/cm$^2$ at an accelerating voltage of 35 KeV through the mask to form an ion-implanted layer 26. Hydrogen ions are further implanted with a dosage of $4.4 \times 10^{16}$ ions/cm$^2$ at an accelerating voltage 80 KeV. It is noted that the isolated ion-implanted region 24 located within the region 27 is exposed through the mask during the ion implantation. Thus, the isolated ion-implanted region 24 is implated under the same ion-implantation condition as the layer 26 which is to serve as a propagation track. Though the region 27 has been initially implanted with a smaller dosage as compared with the region 26, it is of course that the region 27 may be implanted with no ions.

Figure 11:
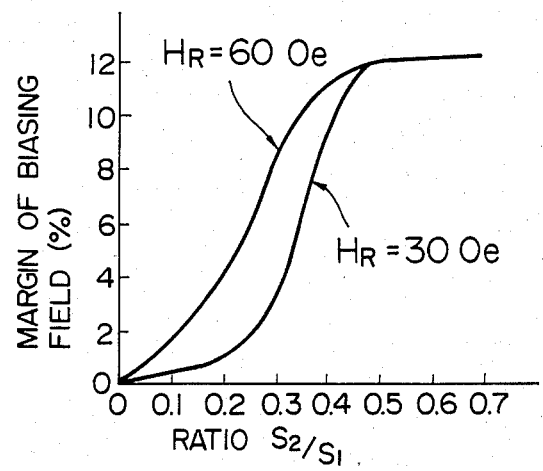
FIG. 11 is a view for graphically illustrating changes in margin of the biasing magnetic field as a function of the ratio of area between the ion-implanted and non-implanted regions shown in FIG. 10.

The magnetic bubbles can now be propagated along the portions 21, 22 and 23 of the propagation track in a similar manner as is in the other portions of the propagation track. FIG. 10 shows a propagation track of the same pattern as the one shown in FIG. 9. A number of propagation tracks among which ratios of the area $S_2$ of the isolated ion-implanted region 24 to the area $S_1$ of the region enclosed by a closed curve 28 differ from one another, were formed to examine the bubble propagation characteristics of the individual propagation tracks. The results of the examination are graphically shown in FIG. 11, in which margin of the biasing magnetic field which represents a range of the biasing magnetic field capable of propagating the magnetic bubble divided by the center value of the range is taken along the ordinate with the ratio of $S_2/S_1$ being taken along the abscissa. The rotating magnetic fields of 60 Oe and 30 Oe were employed. In the case where no isolated ion-implanted region 24 is formed at all in the region 27 which is implanted with no ion or alternatively ion-implanted only to an insufficient degree, that is, the ratio $S_2/S_1$ is zero, the margin of the biasing field is also zero. As the ratio $S_2/S_1$ increases, the propagation characteristic is correspondingly improved. It will be seen that the substantially satisfactory propagation characteristic can be attained when the ratio $S_2/S_1$ is about 0.5.

Figure 12:
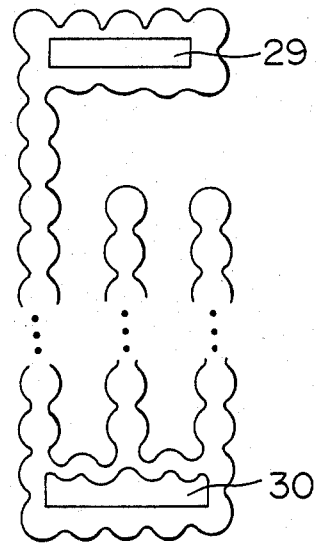
FIG. 12 is a view showing a part of a magnetic bubble device to which the invention is applied and in which a minor loop is constituted only by the propagation track formed by ion implantation.

FIG. 12 shows an embodiment of the invention applied to a magnetic bubble memory device in which a minor loop is constituted only by the propagation track formed by ion implantation. In the case of this embodiment, an isolated ion-implanted region 29 of a rectangular form is provided as shown in an upper part of FIG. 12 is addition to an isolated ion-implanted region 30 shown in a lower part of the same figure as enclosed by a rectangle having an upper meandering side. With this structure, the bubble propagation characteristic can be protected from deterioration.

Figure 13:
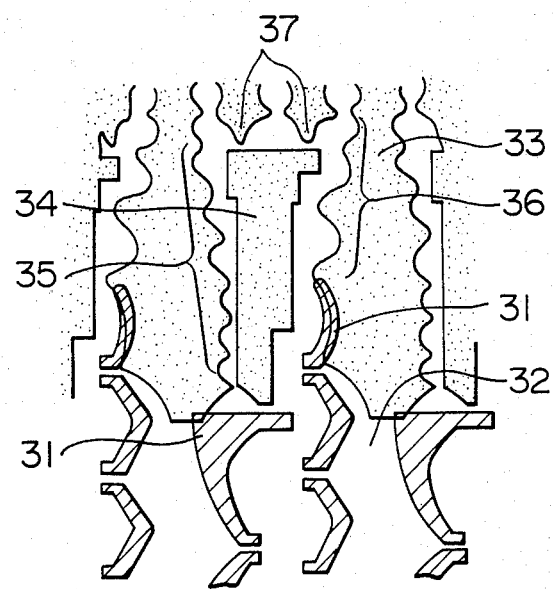
FIG. 13 is a view showing a part of a magnetic bubble memory device to which the invention is applied and in which a minor loop constituted by the propagation track formed by ion implantation and the propagation track formed of a soft magnetic material.

FIG. 13 shows another embodiment of the invention applied to a magnetic bubble memory device in which a minor loop is constituted by both the propagation track formed by ion implantation and the propagation track formed of a soft magnetic material such as permalloy in the same chip. In particular, a portion including junctions between both the propagation tracks is shown. A region 32 underlying a pattern 31 of soft magnetic material is not implanted with ions so deeply as necessary for realizing the bubble propagation tracks but implanted only shallowly for suppressing the generation of hard bubbles. On the other hand, a region denoted by 33 in FIG. 13 is implanted with ions deeply under the conditions of ion implantation required for realizing the bubble propagation track. A region 34 is an isolated region implanted with ions according to the teaching of the invention. This island-like region 34 is deeply implanted with ions. By providing this region 34, the bubble propagation characteristic of propagation track portion 35, 36 and 37 is prevented from being deteriorated.

As will be appreciated from the foregoing, the invention has now provided a magnetic bubble memory device exhibiting a large propagation margin, i.e. capable of operating stably regardless of variations in the intensity of magnetic field by virtue of such arrangement that an ion-implanted region is additionally provided within a substantially non-implanted region of a large area located at the rear side of the cusps for the purpose of decreasing the area of the substantially non-implanted region enclosed by the propagation track to thereby overcome the problem of the difficulty of bubble propagation.

We claim:

1. A magnetic bubble memory device comprising a magnetic bubble propagation track formed through ion implantation, wherein a first region enclosed by said propagation track and implanted with ions on a condition differing from the condition of ion implantation for forming said bubble propagation track or not implanted with ions at all is provided with a second island-like isolated region formed therein by ion implantation on the same condition as the condition of ion implantation for forming said bubble propagation track.

2. A magnetic bubble memory device according to claim 1, wherein said propagation track is disposed at a junction between a minor loop and a major loop.

3. A magnetic bubble memory device according to claim 1, wherein a ratio of the area of said second region to the area of said first region is not smaller than 0.5 and not greater than 1.

4. A magnetic bubble memory device according to claim 1, wherein said second region is of a form enclosed by straight lines.

5. A magnetic bubble memory device according to claim 1, wherein said second region is of a rectangular form.

6. A magnetic bubble memory device according to claim 1, wherein said second region is of a form similar or approximating to that of said first region.

7. A magnetic bubble memory device according to claim 1, wherein a part of said second region is of a form similar or approximating to that of said first region.

* * * * *